(12) United States Patent
Vona, Jr. et al.

(10) Patent No.: US 6,700,092 B2
(45) Date of Patent: *Mar. 2, 2004

(54) PULSING INTELLIGENT RF MODULATION CONTROLLER

(75) Inventors: Daniel J. Vona, Jr., Rochester, NY (US); Aaron T. Radomski, Wyoming, NY (US); Kevin P. Nasman, North Chili, NY (US); William R. Pulhamus, Jr., Bloomfield, NY (US)

(73) Assignee: ENI Technology, Inc., Rochester, NY (US)

( * ) Notice: Subject to any disclaimer, the term of this patent is extended or adjusted under 35 U.S.C. 154(b) by 65 days.

This patent is subject to a terminal disclaimer.

(21) Appl. No.: 10/227,157

(22) Filed: Aug. 23, 2002

(65) Prior Publication Data

US 2003/0024907 A1 Feb. 6, 2003

Related U.S. Application Data

(63) Continuation of application No. 09/827,880, filed on Apr. 6, 2001, now Pat. No. 6,459,067.

(51) Int. Cl.[7] ............................................... B23K 10/00
(52) U.S. Cl. ........................... 219/121.54; 219/121.43; 219/121.48; 313/231.31
(58) Field of Search .................. 219/121.43, 121.59, 219/121.57, 121.54, 121.48; 313/231.31; 427/492, 58, 248.1, 255.6, 491, 535, 569, 585

(56) References Cited

U.S. PATENT DOCUMENTS

| | | | |
|---|---|---|---|
| 5,621,412 A | 4/1997 | Sharpe et al. | |
| 5,714,917 A | 2/1998 | Ella | |
| 5,973,782 A | 10/1999 | Bomse | |
| 5,985,375 A | * 11/1999 | Donohoe et al. | ........... 427/492 |
| 6,126,778 A | 10/2000 | Donohoe et al. | |

* cited by examiner

Primary Examiner—Mark Paschall
(74) Attorney, Agent, or Firm—Harness, Dickey & Pierce, P.L.C.

(57) ABSTRACT

A method of controlling an output of a generator is provided. The output provides an output signal having a settling time to a load having an impedance. The settling time of the output signal is determined. The output signal is amplitude modulated with a modulation waveform. A sense signal is generated that is representative of the modulated output signal. The sense signal is sampled at a sampling time based upon the settling time of the output signal. A digital representation of the sampled sense signal is generated. The amplitude modulation of the output is controlled based upon the digital representation of the sampled sense signal.

7 Claims, 6 Drawing Sheets

PULSING INTELLIGENT RF MODULATION CONTROLLER

CROSS-REFERENCE TO RELATED APPLICATIONS

This application is a continuation of U.S. patent application Ser. No. 09/827,880, filed on Apr. 6, 2001 now U.S. Pat. No. 6,459,067. The disclosure of the above application is incorporated herein by reference.

FIELD OF THE INVENTION

The present invention relates generally to generators that provide a power output, and in particular to power generators that supply a modulated output waveform.

BACKGROUND OF THE INVENTION

Generators that provide a modulated output are limited in several respects by the waveform sensing/control techniques that are used for controlling the output. Typically, conventional generators employ a control method that tracks the positive-going slope of a sense signal that is representative of the output waveform. The rising edge of the sense signal is tracked by a charge-dump-hold circuit (CDH circuit). The CDH circuit continues tracking the waveform until, after a predetermined amount of time to account for plant settling time, the value of the sense signal is measured. A hold circuit is activated simultaneously with the disabling of the output modulation, providing an effective continuous DC output regardless of the modulation parameters. Output characteristics, such as delivered power, are computed by multiplying the measured parameter by the pulsed output duty cycle. For example, for a 50 percent duty cycle, with a peak power measurement of 1000 watts, the calculated delivered output power would be 500 watts.

Limitations of the described sensing/control technique include the need for pre-measuring the settling time of the plant, the CDH circuit response limits the bandwidth of the system, the technique cannot track both the positive and negative edges of the output waveform, and arbitrary amplitude output waveforms are not controllable. The settling time is generally obtained based upon lab experiments, and stored for use during system operation. The settling time of the plant will vary for many systems based on the load impedance that is being driven. By using a settling time based on a single load impedance, the accuracy of the calculated output parameters may vary depending on the load impedance, limiting use of the control technique to matched systems or systems that can withstand high levels of inaccuracy in the computation of the output characteristics.

The restriction on system bandwidth imposed by the CDH circuit response time may be the limiting factor in determining the minimum pulse width of the output waveform. Having the measurement system (i.e. the CDH circuit) limit the speed of the generator system is opposite to normal engineering practice. An inability to track both the positive and negative edges limits the control technique to controlling output waveforms in which a pulse returns to zero during the low cycle of the modulating waveform. Controlling arbitrary amplitude modulation waveforms without the ability to track both edges is generally unattainable. Therefore, conventional generator control techniques are typically limited to controlling pulsed output waveforms unless the generator system can tolerate inaccurate generation and measurement of output characteristics.

While conventional generator control techniques can be used to provide a modulated output waveform under limited operating conditions, those techniques have not proven capable of providing generators that are not limited by the sensor/measurement circuit.

SUMMARY OF THE INVENTION

A method and system of controlling an output of a generator is provided. The output provides an output signal having a settling time to a load having an impedance. The settling time of the output signal is determined. The output signal is amplitude modulated with a modulation waveform. A sense signal is generated that is representative of the modulated output signal. The sense signal is sampled at a sampling time based upon the settling time of the output signal. A digital representation of the sampled sense signal is generated. The amplitude modulation of the output is controlled based upon the digital representation of the sampled sense signal.

Further areas of applicability of the present invention will become apparent from the detailed description provided hereinafter. It should be understood that the detailed description and specific examples, while indicating the preferred embodiment of the invention, are intended for purposes of illustration only and are not intended to limited the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
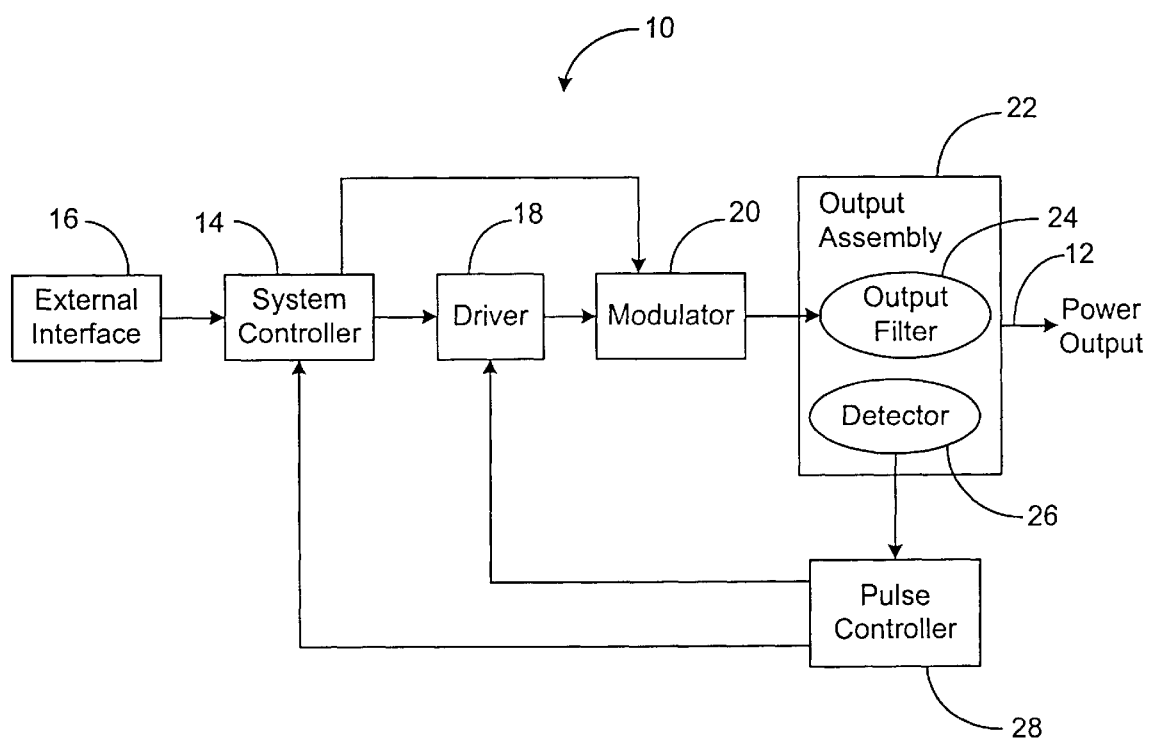
FIG. 1 is a block diagram illustrating a presently preferred embodiment of the invention.

The following description of the preferred embodiment(s) is merely exemplary in nature and is in no way intended to limit the invention, its application, or uses. Referring to FIG. 1, a plasma generator 10 for providing a power output 12 to a plasma processing system (not shown) is illustrated. The scope of the invention includes providing a power output 12 in which the controlled characteristic may be the output voltage, output current, output forward power, output reflected power, and output energy. The plasma generator 10 includes a system controller 14 for generating control signals and processing monitoring and fault signals. An external interface 16 is connected to the system controller 14 through an interface bus for communicating information with external equipment or users. A driver 18 connected to the system controller 14 generates buffered drive signals corresponding to the control signals. The drive signals drive a modulator 20 that converts rectified line power to an unfiltered output. The unfiltered output is coupled to an output assembly 22 that includes an output filter 24 and a detector 26. The unfiltered output is filtered by the output filter 24 to generate the power output 12. The detector 26 generates a sense signal that corresponds to at least one signal characteristic of the output voltage 12. Preferably, a V/I probe is employed as the detector 26, however the scope of the invention includes other detectors such as mixers and directional couplers. A pulse controller 28 converts the sense signal to a digitized sense signal and processes the output voltage signal characteristic. The pulse controller 28 generates a modulation signal 30 and an amplitude control signal 32. The modulation signal 30 is a single line signal coupled to the driver 18 for controlling the amplitude and frequency of the driver output. The digitized feedback signal 32 is a digitized signal that is coupled to the system controller 14 through a digital bus 34. Information supplied by the digitized feedback signal 32 is used by the system controller 14 to control the amplitude of the power output 12. While the pulse controller 28 is particularly suitable for being incorporated into a plasma generator, it will be appreciated that the pulse controller may be used in a variety of generators that provide a modulated output.

Figure 2:
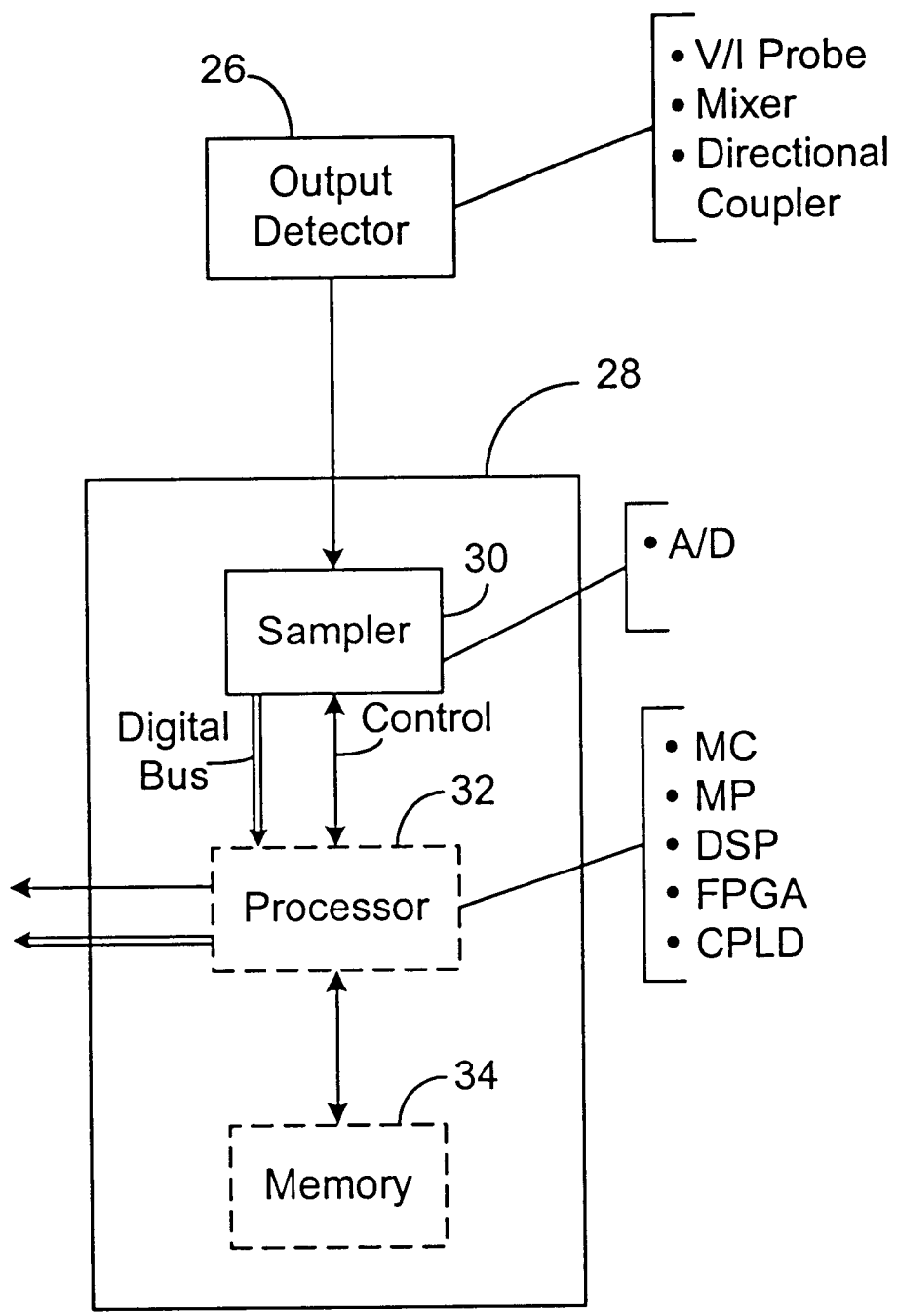
FIG. 2 is a block diagram illustrating an output detector coupled to a pulse controller in accordance with the teachings of the invention.

Referring to FIG. 2, a detailed block diagram of a presently preferred embodiment of the pulse controller 28 is shown. The pulse controller 28 includes a sampler 30 coupled to the output detector 26. The sampler 30 samples and converts the sense signal from the output detector 26 to a digitized sense signal. Preferably, the sampler is a low-speed analog-to-digital converter. A processor 32 controls the sampler 30 and processes the digitized sense signal. The processor 32 is preferably a uController, however other processors such as uProcessors, digital signal processors, field programmable gate arrays, and programmable logic devices are within the scope of the invention. In the preferred embodiment, separate processors are used for the pulse controller 28 and system controller 14 so that the pulse controller 28 can be located close to the detector 26. A memory 34 provides a data storage function for the processor 32.

Figure 3A:
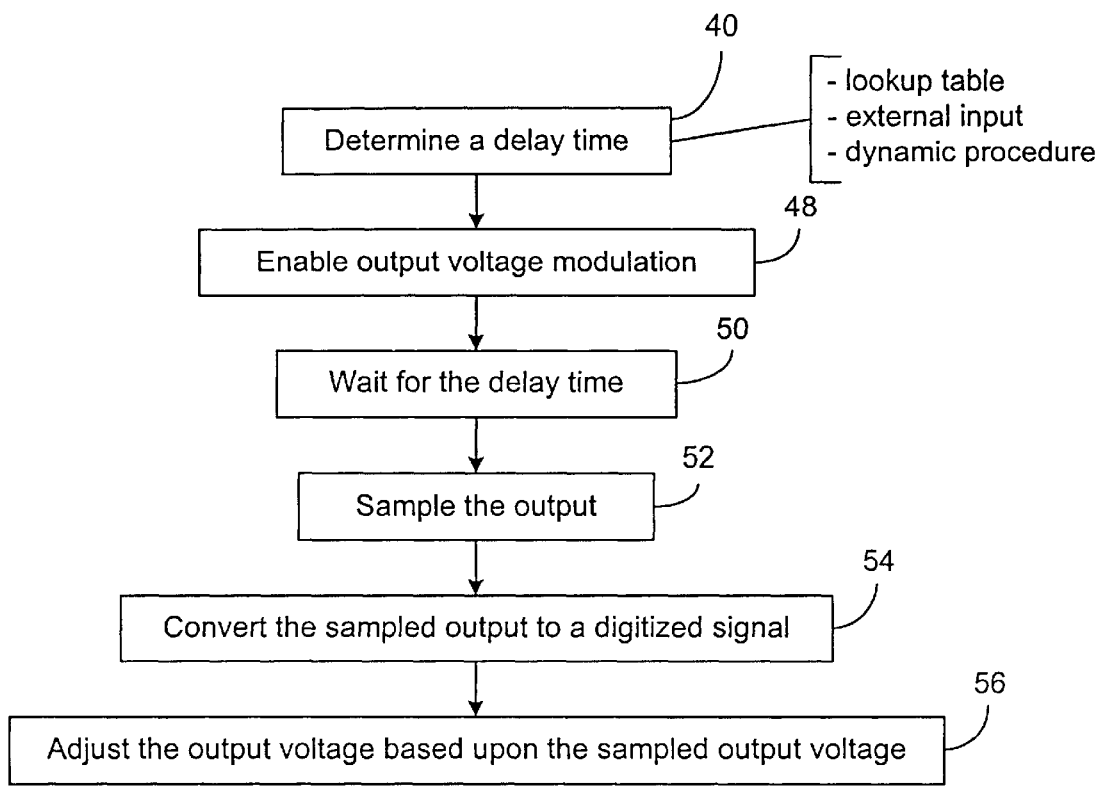
FIG. 3A is flow diagram illustrating a process for controlling a generator power output in accordance with the teachings of the invention.
Figure 3B:
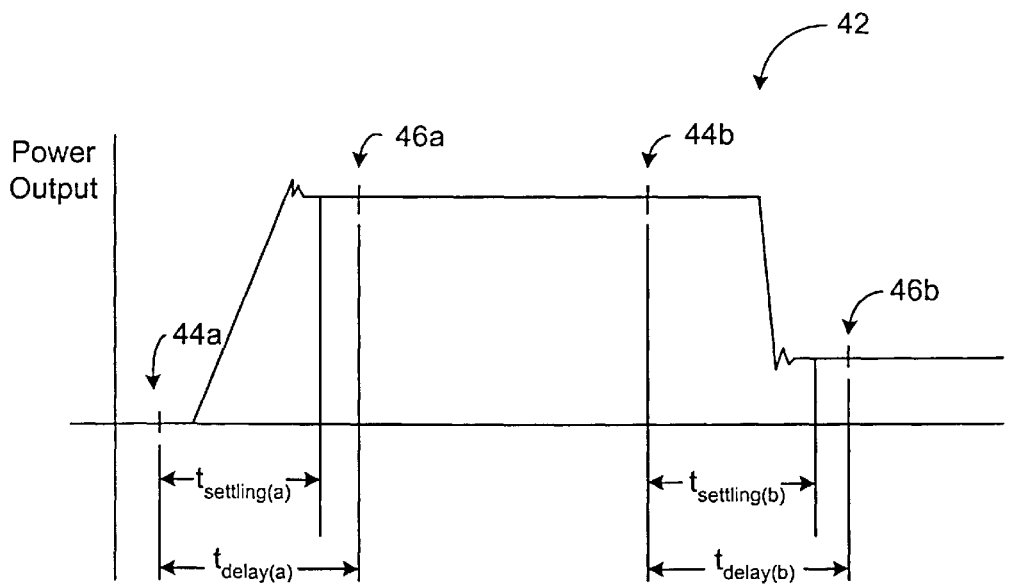
FIG. 3B illustrates a waveform depicting timing relationships of the power output.

Referring to FIGS. 3A and 3B, a process for controlling the output of the plasma generator 10, and an output waveform 42 of the generator output are respectively illustrated. At step 40 a delay time is determined beginning from when a change in the generator output is commanded at point 44 until the output waveform 42 attains a predetermined level such as a stabilized level following the output settling time, point 46. Methods of determining the delay time include using a lookup table, receiving an external input, and dynamically determining the delay time by running an iterative procedure that is explained in detail in a later section of this specification. The lookup table includes delay times that may be a function of several operating parameters such as settling time, initial output voltage level, final output voltage level, and temperature. The delay times corresponding to the operating parameters are preferably determined by measuring the settling times corresponding to actual operating states of the generator 10. However, it is within the scope of the invention to determine the lookup table delay times by calculating delay times, running computer simulations, and measuring delay times associated with a baseline generator. At step 48 the output voltage modulation is enabled at point 44. At step 50 the pulse controller 28 waits for the predetermined time delay before measuring the generator output. At step 52 the pulse controller 28 samples the generator output (point 46). At step 54 the sampled generator output is converted to a digitized signal. By estimating a time delay, only a single sample of the output after a change of state is required to be digitized to determine the level of the generator output. Therefore, a relatively slow analog-to-digital converter is preferably used for converting the sampled output to the digitized signal. In addition, the conversion of the sampled signal to a digitized signal is preferably accomplished in close physical proximity to the detector 26 to minimize noise coupling to the sampled signal. In contradistinction, conventional generators use a very high-speed sampler and digital converter combination that samples and converts the generator output continuously throughout the period extending from when modulation of the output is enabled until the output stabilizes. Very high speed sampler and digital converter combinations are very expensive and introduce errors into the measurement of the output due to switching noise and errors in the sampler that are a result of the high speed operation. At step 56 the modulation level is adjusted in response to the digitized signal to reduce any error between the generator output and a reference voltage.

Figure 4:
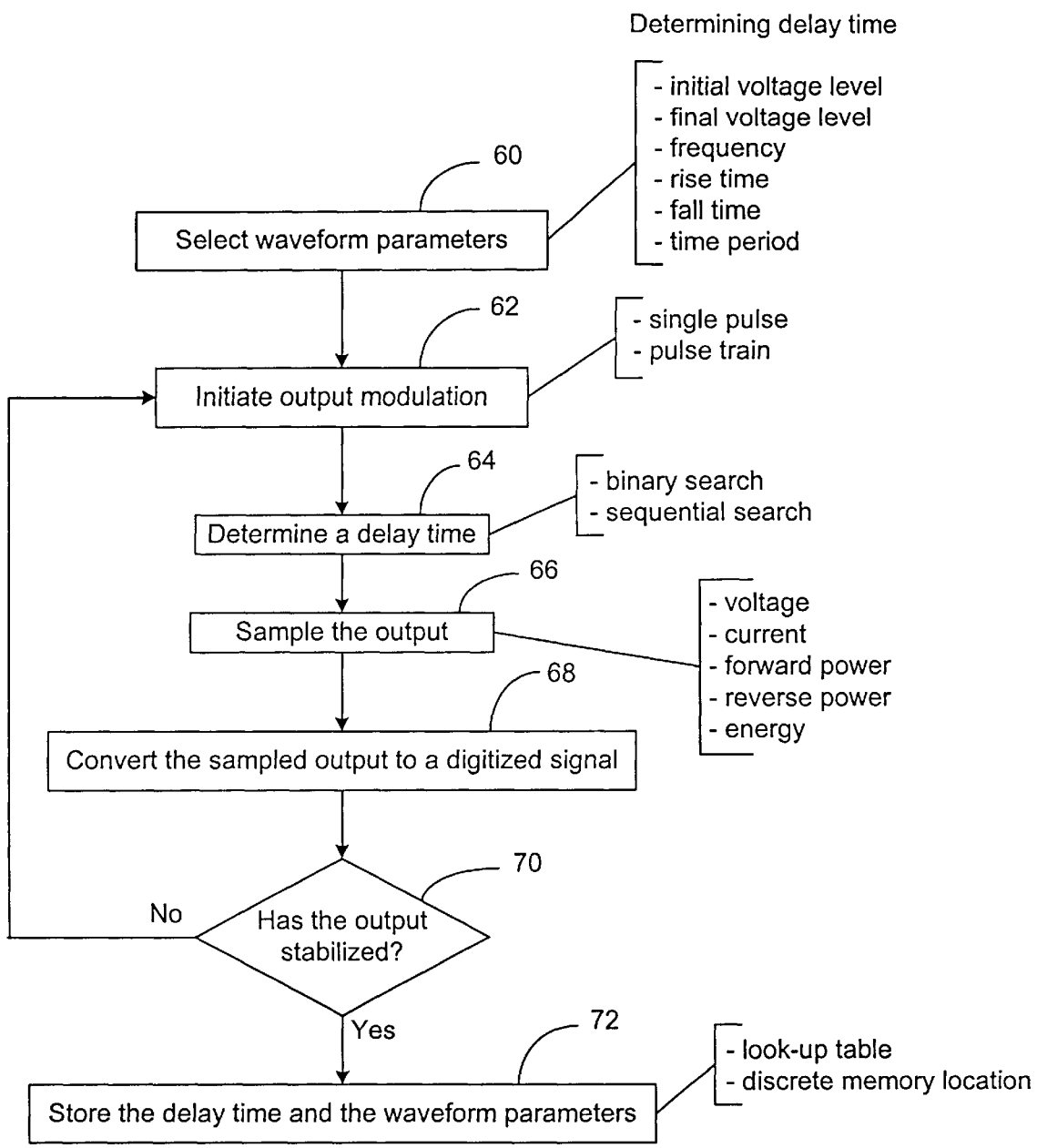
FIG. 4 is a flow diagram illustrating a process for determining a delay time in accordance with the teachings of the invention.

Referring to FIG. 4, a process for determining the length of time extending from the initiation of modulation to when the generator output is stable is shown. At step 60 the waveform characteristics for the generator output are selected. The selectable waveform characteristics include initial voltage level, final voltage level, frequency, rise time, fall time, and pulse time period. At step 62 the output modulation is initiated. The modulation waveform is preferably set to a single pulse, however other waveforms such as a burst of widely spaced pulses and a continuous string of widely spaced pulses are within the scope of the invention. At step 64 an estimated delay time is selected based upon a search criteria such as a binary search or a sequential search. The estimated delay time represents the estimated time that is expected to elapse from the initiation of modulation until the generator output is stable. At step 66 a sample is taken of the output when the estimated delay time has elapsed. Preferably, only a single sample is taken per transition of the output so that a low-speed, low-cost D/A may be employed. At step 68 the sampled output is converted to a digitized signal. At step 70 the digitized signal is evaluated to determine if the output has passed through the transition and stabilized. If the output has not stabilized, then control returns to step 62 and another modulation pulse is transmitted. If the output has stabilized, then at step 72 the delay time and the waveform parameters are stored in a look-up table for later reference.

Figure 5A:
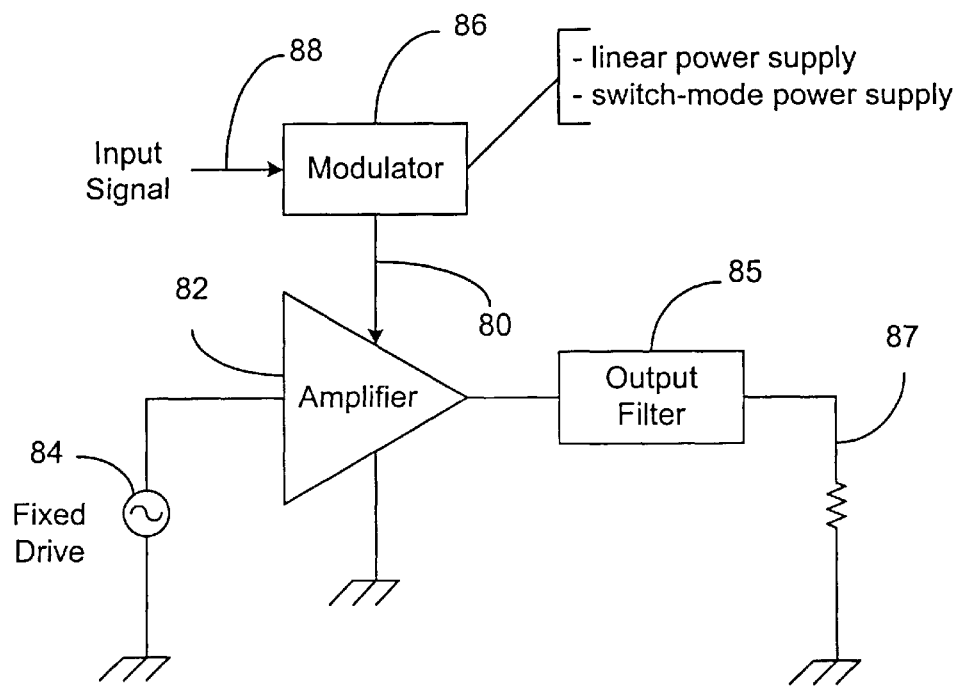
FIG. 5A illustrates an embodiment of an overdriven amplifier circuit in accordance with the teachings of the invention.
Figure 5B:
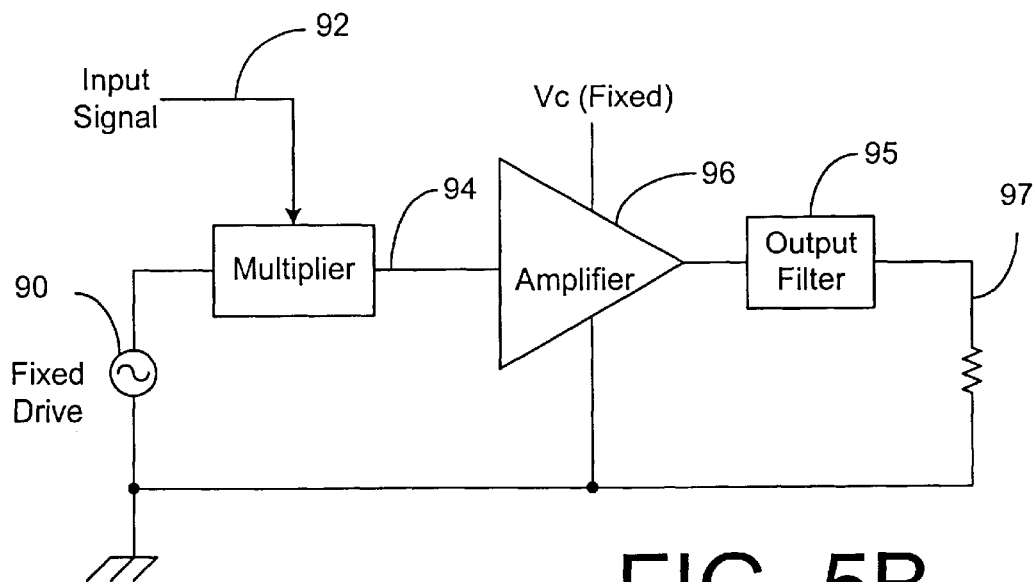
FIG. 5B illustrates an embodiment of an linear RF amplifier circuit in accordance with the teachings of the invention.

Referring to FIGS. 5A and 5B, two methods for amplitude modulating a plasma generator output are shown. The amplitude modulated output is used to more closely control the process that the plasma generator is being used for. The output of a plasma processing system generator operating at any frequency including DC is amplitude modulated with a second waveform of any waveshape or frequency to produce any arbitrary output envelope. The frequency spectrum of the generator output may be controlled to produce additional frequencies that are not present in the original inputs. In addition, the amplitudes, input frequencies, and derivatives of the inputs are varied as a function of the amplitude and DC offset of the modulating signal.

In FIG. 5A, a supply voltage 80 of an overdriven amplifier 82 is modulated to produce a power envelope that is the square of the applied voltage envelope. A fixed drive 84 provides a signal for overdriving the amplifier 82. The supply voltage 80 is generated by a modulator 86 such as linear power supplies and switch-mode power supplies. The modulator 86 is driven by an input signal 88 having a periodic or non-periodic waveshape. Bandwidths of greater than 100 kHz are attainable with the overdriven amplifier 82. A replica of the waveshape is produced in the envelope of the generator output by the modulator varying the supply voltage 80.

Referring to FIG. 5B, another amplitude modulation embodiment in accordance with the principles of the invention is illustrated. A fixed drive 90 is multiplied with an input signal 92 to produce a modulated input signal 94 to a linear RF amplifier 96. The linear RF amplifier 96 amplifies the modulated input signal 94 to produce the signal for modulating the plasma generator output. The linear amplifier embodiment of FIG. 5B advantageously produces the same amplitude-modulated output as the supply voltage modulation of FIG. 5A with a wider modulation bandwidth. Although, only two techniques for amplitude-modulating the output of a plasma generator output have been shown, the scope of the invention includes using other methods for amplitude-modulating a plasma generator output.

Figure 6:
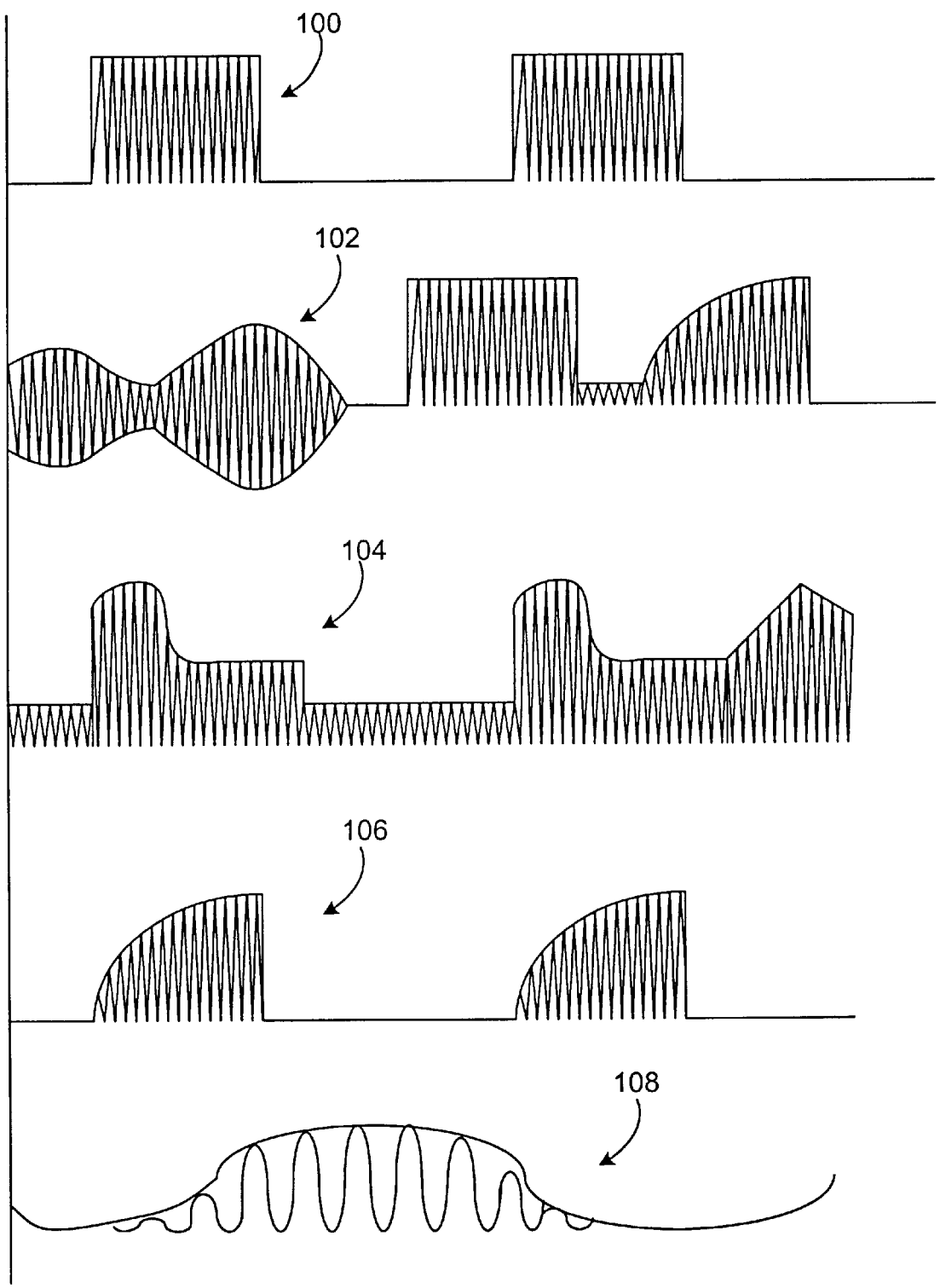
FIG. 6 illustrates several waveforms depicting plasma generator output envelopes.

Referring to FIG. 6, several examples of waveshapes from a plasma generator having an amplitude modulated output in accordance with the principles of the invention are illustrated. The first waveform 100 depicts a generator output in which the edges of a square pulse are rounded off in a controlled manner by modulating the square pulse with a sinusoid of a preselected frequency. By selecting a sinusoid with a lower frequency, greater rounding of the pulse edge is attained.

Waveform 102 shows an example of an output signal of an embodiment of an amplitude modulated generator output in which highly complex shapes are replicated.

Waveforms 104 and 106 illustrate output signals of an embodiment of an amplitude modulated generator output in which the amplitude and offset vary anywhere within the dynamic range of the generator.

Waveform 108 shows an output signal of an embodiment of an amplitude modulated generator in which multiple frequencies are generated. Advantageously only a single amplitude modulated generator is necessary to generate the output signal, instead of multiple generators each generating a different frequency component of the output signal.

The description of the invention is merely exemplary in nature and, thus, variations that do not depart from the gist of the invention are intended to be within the scope of the invention. Such variations are not to be regarded as a departure from the spirit and scope of the invention.

We claim:

1. A method for controlling an output of a generator, the output providing an output signal to a plasma chamber comprising:

amplitude modulating the output signal to the plasma chamber with a modulating waveform;

generating a sense signal that varies in accordance with the modulated output signal to the plasma chamber;

sampling the sense signal;

generating a digital representation of the sampled sense signal; and controlling the modulating waveform to vary the output based upon the digital representation of the sampled sense signal.

2. The method of claim 1, wherein the modulating waveform is periodic.

3. The method of claim 2, wherein the modulating waveform is non-periodic.

4. The method of claim 1, wherein the frequency of the modulating waveform varies.

5. The method of claim 1, wherein the amplitude modulating the output signal varies the power of the output signal.

6. A plasma generator for generating an amplitude-modulated to be applied to a load, comprising:

an amplitude-modulation amplifier for generating a modulation signal;

a fixed drive coupled to the amplitude-modulated amplifier for supplying a drive signal;

the amplitude-modulated amplifier combining the drive signal with an input signal having a waveshape, to generate the modulation signal with a waveshape corresponding to the input signal, wherein the modulation signal is variable; and an output filter coupled between the amplitude-modulated amplifier and the load to supply the amplitude-modulated output to the load.

7. A method for controlling an output signal from a plasma generator, comprising the steps of:

providing an output signal to the plasma chamber; and amplitude modulating the output signal with a modulating waveform, wherein the modulating waveform is non-periodic.

* * * * *

UNITED STATES PATENT AND TRADEMARK OFFICE
CERTIFICATE OF CORRECTION

PATENT NO. : 6,700,092 B2
DATED : March 2, 2004
INVENTOR(S) : Daniel J. Vona, Jr. et al.

It is certified that error appears in the above-identified patent and that said Letters Patent is hereby corrected as shown below:

Column 2,
Line 26, "limited" should be -- limit --.
Line 39, after "is" insert -- a --.
Line 51, "an" (second occurrence) should be -- a --.

Column 6,
Line 30, after "modulated" insert -- signal --.

Signed and Sealed this

Tenth Day of August, 2004

JON W. DUDAS
*Acting Director of the United States Patent and Trademark Office*